US006980592B1

(12) United States Patent
Rambaud et al.

(10) Patent No.: US 6,980,592 B1
(45) Date of Patent: Dec. 27, 2005

(54) DIGITAL ADAPTIVE EQUALIZER FOR T1/E1 LONG HAUL TRANSCEIVER

(75) Inventors: Marta M. Rambaud, Allentown, PA (US); Pablo Vila, Madrid (ES)

(73) Assignee: Agere Systems Inc., Allentown, PA (US)

( * ) Notice: Subject to any disclaimer, the term of this patent is extended or adjusted under 35 U.S.C. 154(b) by 0 days.

(21) Appl. No.: 09/471,806

(22) Filed: Dec. 23, 1999

(51) Int. Cl.[7] .......... H03H 7/40
(52) U.S. Cl. .......... 375/232
(58) Field of Search .......... 375/225, 232, 375/229, 285, 254, 296, 233, 350, 267; 370/290, 370/291; 379/398, 394, 22; 708/322, 323, 708/320, 321

(56) References Cited

U.S. PATENT DOCUMENTS

| | | | | |
|---|---|---|---|---|
| 4,517,596 | A * | 5/1985 | Suzuki | 375/240.05 |
| 5,014,232 | A * | 5/1991 | Andre | 708/322 |
| 5,157,395 | A * | 10/1992 | Del Signore et al. | 341/143 |
| 5,335,357 | A * | 8/1994 | Fennell et al. | 455/503 |
| 5,526,378 | A * | 6/1996 | Knutson et al. | 375/229 |
| 5,557,560 | A * | 9/1996 | Dix et al. | 708/3 |
| 5,559,642 | A * | 9/1996 | Hoogendoorn et al. | 360/27 |
| 5,577,117 | A * | 11/1996 | Rabipour et al. | 379/414 |
| 5,689,572 | A * | 11/1997 | Ohki et al. | 381/71.3 |
| 5,754,437 | A * | 5/1998 | Blazo | 702/75 |
| 5,872,815 | A * | 2/1999 | Strolle et al. | 375/321 |
| 5,880,973 | A * | 3/1999 | Gray et al. | 702/190 |
| 5,915,235 | A * | 6/1999 | DeJaco et al. | 704/234 |
| 5,953,431 | A * | 9/1999 | Yashima et al. | 381/103 |
| 5,974,152 | A * | 10/1999 | Fujinami | 381/1 |
| 6,115,589 | A * | 9/2000 | Ferrer et al. | 455/249.1 |
| 6,125,155 | A * | 9/2000 | Lesthievent et al. | 375/350 |
| 6,195,414 | B1 * | 2/2001 | Simmons et al. | 379/22 |
| 6,210,334 | B1 * | 4/2001 | Phillips | 600/453 |
| 6,246,444 | B1 * | 6/2001 | Kim | 348/614 |
| 6,275,836 | B1 * | 8/2001 | Lu | 708/313 |
| 6,310,566 | B1 * | 10/2001 | McNeely | 341/123 |
| 6,321,246 | B1 * | 11/2001 | Page et al. | 708/316 |
| 6,343,130 | B2 * | 1/2002 | Yamazaki | 381/309 |
| 6,389,069 | B1 * | 5/2002 | Mathe | 375/232 |
| 6,430,671 | B1 * | 8/2002 | Smith | 711/220 |

(Continued)

*Primary Examiner*—Emmanuel Bayard

(57) ABSTRACT

The present invention relates to the implementation of a digital adaptive equalizer for a T1/E1 long haul transceiver which is capable of adapting to a wide range of cable types, cable lengths, and/or other data transmission impairments, particularly when the transmission path type and/or length are unknown. The digital adaptive equalizer contains two filter blocks, i.e., an IIR filter and a FIR filter, together with a filter selector block to select a best IIR filter based on an error estimation of the received data. Only a few sets of coefficients are found to be necessary to allow proper digital equalization of a large number of cable types and/or lengths. A filter selector block selects a desired set of coefficients corresponding to the optimum IIR filter. The coefficients may be programmed into volatile memory (e.g., RAM) or non-volatile memory (e.g., Flash). Alternatively, the coefficients may be hardwired into the IIR filter. The back end of the digital adaptive equalizer contains an adaptive finite impulse response (FIR) filter. In the disclosed embodiment, the FIR filter uses a least mean square (LMS) algorithm for adaptation to the unknown or changed T1 or E1 transmission channel or medium. The adaptive FIR filter adjusts the output from the IIR filter to accurately match the inverse response of the unknown channel used to transmit the received T1/E1 signal. Equalization may be temporarily frozen if periodic patterns are detected in the received T1/E1 signal. A restored T1 or E1 signal is output from the FIR filter, and thus from the digital adaptive equalizer.

26 Claims, 8 Drawing Sheets

EQUALIZER ARCHITECTURE

U.S. PATENT DOCUMENTS

| | | | | |
|---|---|---|---|---|
| 6,438,162 | B1 * | 8/2002 | Boyd et al. | 375/232 |
| 6,519,010 | B2 * | 2/2003 | Twitchell et al. | 348/608 |
| 6,539,063 | B1 * | 3/2003 | Peyla et al. | 375/267 |
| 6,553,121 | B1 * | 4/2003 | Matsuo et al. | 381/17 |
| 6,668,029 | B1 * | 12/2003 | Koslov et al. | 375/350 |
| 2002/0030762 | A1 * | 3/2002 | Kishimoto | 348/625 |

* cited by examiner

GENERAL FRONT END ARCHITECTURE

EQUALIZER ARCHITECTURE

IIR FILTER BLOCK IMPLEMENTATION

FILTER SELECTION BLOCK DESCRIPTION

FILTER SELECTION BLOCK IMPLEMENTATION

ADAPTIVE FIR FILTER DESCRIPTION

ADAPTIVE FIR FILTER BLOCK IMPLEMENTATION

DIGITAL ADAPTIVE EQUALIZER FOR T1/E1 LONG HAUL TRANSCEIVER

BACKGROUND OF THE INVENTION

1. Field of the Invention

This invention relates generally to T1/E1 type communications. More particularly, it relates to the implementation of a digital adaptive equalizer for a T1 or E1 long haul transceiver.

2. Background of Related Art

Telecommunications and more recently data communications commonly utilize T1 or E1 rate long haul transceivers for transmitting large amounts of data. A T1 type signal (1.544 Mb/s) is a standard 24 channel digital communication standard commonly used in North America. An E1 type signal (2.048 Mb/s) is a standard 30 voice channel or 32 payload channel digital communication standard commonly used in Europe. However, because of the similarities in the data structure and physical layer characteristics of T1 and E1 lines, many commercial components are capable of supporting either a T1 or an E1 standard, often with a bit setting or swap of a termination impedance.

As is known, data transmissions suffer dispersion and other debilitating degradations during transmission, particularly when transmitted over a twisted pair and/or cable.

In particular, FIG. 9 depicts the affects of a transmission path 910 between a T1/E1 transmitter 902 and a complementary T1/E1 receiver 904. The transmission path 910 (e.g., twisted pair, coaxial cable, etc.) typically causes dispersion, attenuation, and/or other distortion with respect to a frequency domain as depicted in FIG. 9, which is ideally compensated by an analog equalizer 912 in the T1/E1 receiver 904.

Conventional T1 or E1 equalizers 912 are analog devices included in the T1/E1 receiver 904 which are specifically adapted and designed to cancel the affects of the known transmission path 910 (e.g., twisted pair, coaxial cable, etc.) and a known length of that transmission path 910, by equalizing the received signal before processing. Thus, a conventional analog equalizer is chosen or designed based on the specific type of cable used, and on the specific length of the cable. Even given a same type cable, generally speaking the longer the cable, the more affected the received T1/E1 signal is by transmission through the path 910.

Conventional analog devices are typically designed with the specific cable type and sometimes even the length of the cable in mind. Thus, as cable length changes and/or as cable types change, conventional analog T1/E1 equalizers require physical changes to the circuit board containing the T1/E1 long haul transceiver to allow proper equalization of the received T1 or E1 signal. This poses delays and reliability issues when changes to a system are incurred, e.g., when increasing or decreasing the length of a T1/E1 cable.

There is a need for a more flexible T1/E1 equalizer which adapts to changes in T1/E1 cable type and/or length without requiring physical hardware changes to the receiving T1/E1 long haul device.

SUMMARY OF THE INVENTION

In accordance with the principles of the present invention, a digital adaptive equalizer for a data communication path comprises a first programmable filter capable of being programmed to implement any of a plurality of filter transfer functions. A filter selector selects any one of the plurality of filter transfer functions for the first programmable filter. A second digital filter receives an output from the first programmable filter.

A method of digitally equalizing a received T1/E1 data signal in accordance with another aspect of the present invention comprises firstly filtering the received T1/E1 data signal using a first digital filter. An output of the first digital filter is adaptively adjusted to accurately match an inverse response of a transmission channel used to transmit the received T1/E1 data signal.

BRIEF DESCRIPTION OF THE DRAWINGS

Features and advantages of the present invention will become apparent to those skilled in the art from the following description with reference to the drawings, in which.

DETAILED DESCRIPTION OF ILLUSTRATIVE EMBODIMENTS

Figure 1:
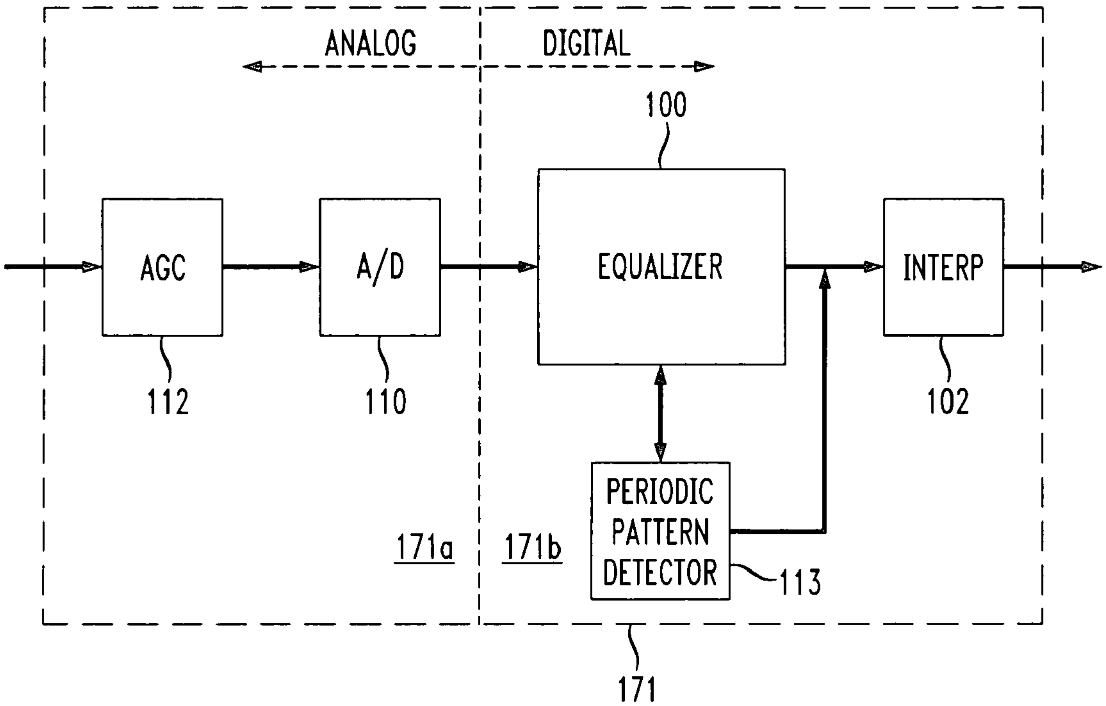
FIG. 1 shows an exemplary embodiment of a front end of a T1/E1 receiver including a digital adaptive equalizer comprising three main blocks, in accordance with the principles of the present invention.

The present invention relates to the implementation of a digital adaptive equalizer for a T1/E1 long haul transceiver (i.e., the receiver portion) which is capable of adapting to a wide range of cable types, cable lengths, and/or other data transmission impairments. The digital adaptive equalizer corrects for or equalizes impairments caused in a T1 or E1 type signal which has presumably been degraded upon transmission, particularly where the cable type and/or length may be unknown (or have changed). The digital adaptive equalizer for T1/E1 long haul transceivers in accordance with the principles of the present invention can be implemented easily using low voltage digital technology. The invention has particular application when the T1/E1 signal has been received through an unknown channel (e.g., an unknown cable type, length, and/or other impediments to ideal transmission).

The digital adaptive equalizer contains two filter blocks, i.e., an IIR filter and a FIR filter, together with a filter selector block.

The IIR filter receives the digitized samples of a received analog signal (e.g., from a suitable analog-to-digital (A/D) converter). Preferably, the IIR includes a programmable set of coefficients, wherein each programmable set of coefficients represents a different IIR filter. Preferably, each set of coefficients is chosen to best represent the expected (or anticipated) cable types and/or lengths for which the T1/E1 long haul transceiver is specified. Only a few sets of coefficients are found to be necessary to allow proper digital equalization of a large number of cable types and/or lengths.

The particular set of coefficients to be programmed (and thus the particular IIR filter) is chosen, e.g., using an error estimation algorithm. The error estimation algorithm detects which IIR filter would be optimum for use given a current set of conditions. The error estimation algorithm may be operated as often as necessary, e.g., at start up of a communication system. Thus, whenever a cable type and/or length might be changed (e.g., whenever the system is moved or a cable is replaced), instead of requiring a physical change of analog components as in conventional analog equalizers, a digital adaptive equalizer for T1/E1 long haul applications need only be re-booted.

A filter selector block selects a desired set of coefficients corresponding to the best IIR filter. The coefficients may be programmed into volatile memory (e.g., RAM) or non-volatile memory (e.g., Flash). Alternatively, the coefficients may be hardwired into the IIR filter.

The back end of the digital adaptive equalizer contains an adaptive finite impulse response (FIR) filter. In the disclosed embodiment, the FIR filter uses a least mean square (LMS) algorithm for adaptation to the unknown or changed T1 or E1 transmission channel or medium. The adaptive FIR filter adjusts the output from the IIR filter to accurately match the inverse response of the unknown channel used to transmit the received T1/E1 signal.

Preferably, the adaptive LMS FIR filter is modified to work under the main problems a T1/E1 signal presents for digital adaptive algorithms, i.e., the fact that the source is correlated and the periodic patterns that the signal might contain.

A restored T1 or E1 signal is output from the FIR filter, and thus from the digital adaptive equalizer, in accordance with the principles of the present invention.

FIG. 1 shows an exemplary embodiment of a front end 171 of a T1/E1 receiver including a digital adaptive equalizer comprising three main blocks, in accordance with the principles of the present invention.

In particular, in FIG. 1, the front end 171 receives a raw T1 or E1 data signal from a transmission path (wired or wireless). The front end 171 includes an analog portion 171*a* and a digital portion 171*b*.

An automated gain control (AGC) in the analog portion 171*a* of the front end 171 receives the raw data signal in analog form, and appropriately couples the received signal to an analog-to-digital (A/D) converter 110 (e.g., an 8-bit A/D converter in the disclosed embodiment). In the disclosed embodiment, the PGA 112 maximizes the dynamic range of the received raw data signal to provide the A/D converter 110 with a constant envelope (e.g., +1 to −1).

The principles of the present invention relate equally to data transmission techniques and data rates other than those specifically at T1 or E1 rates. In the example of the disclosed embodiment using T1 and E1 data rates, the A/D converter 110 is an 8-bit converter which is sampled at a rate of four samples per symbol (i.e., 4×f). In the case of a T1 (i.e., 1.544 Mb/s) digital adaptive equalizer, the input data signal is sampled at four times the T1 rate, or 6.176 MHz. Similarly, in the case of an E1 (i.e., 2.048 Mb/s) digital adaptive equalizer, the input data signal is sampled at four times the E1 rate, or 8.192 MHz.

In the digital portion 171*b* of the front end 171, the equalizer 100 receives the 8-bit samples from the A/D converter 110, equalizes the digitized input data signal, and outputs 8-bit samples. Of course, the present invention relates equally to sample sizes other than those of the disclosed exemplary embodiment, e.g., 10 bits, 12 bits, 16 bits, etc.

An interpolator 102 in the digital portion 171*b* of the front end 171 interpolates the signals from the equalizer 100 into an interpolated output signal having a much faster output sampling rate. For example, the exemplary interpolator 102 interpolates and outputs samples at 96 times the T1 or E1 rate (i.e., 148.224 MHz or 196.608 MHz, respectively). The output of the interpolator 102 is passed to a timing recovery stage to achieve the requirements (e.g., telecommunications standards such as jitter specifications) of a recovered T1/E1 signal.

Figure 2:
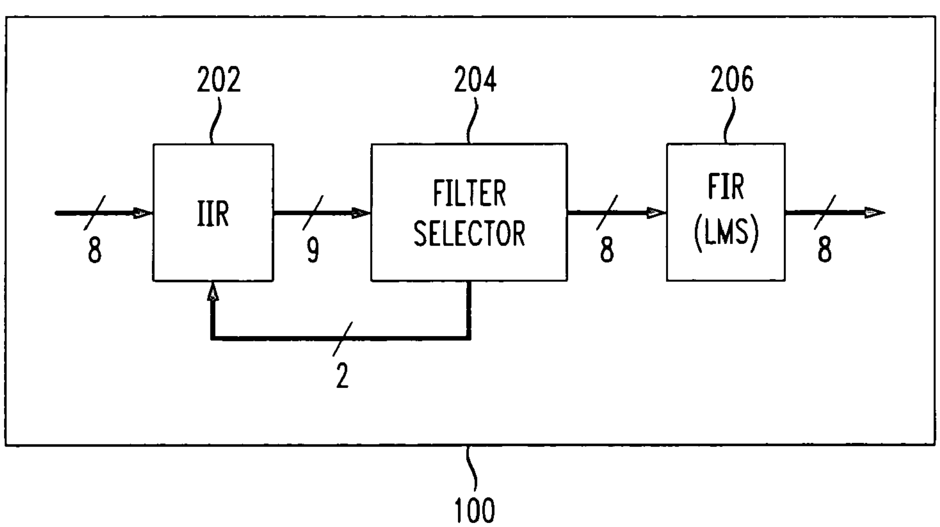
FIG. 2 shows a block diagram of a digital adaptive equalizer including two filters and a control block, in accordance with the principles of the present invention.

FIG. 2 shows a block diagram of a digital adaptive equalizer 100 including two filters and a control block, in accordance with the principles of the present invention.

In particular, the digital adaptive equalizer 100 includes an infinite impulse response (IIR) filter 202, followed by a filter selector 204, and then by a finite impulse response (FIR) filter 206.

The IIR filter 202 in the disclosed embodiment is a $7^{th}$ order filter. The IIR filter 202 effectively opens the signal eye-diagram of the received digitized data signal.

The filter selector 204 selects the optimum IIR filter, and programs the related coefficients into the IIR filter 202 based on that selection. The filter selector 204 also performs timing and process control for the equalizer 100, and converts the 9-bit output from the IIR filter 202 into 8-bit samples for use by the FIR filter 206.

The adaptive FIR filter 206 includes a finite impulse response filter having, e.g., 16 taps. In the disclosed embodiment, the adaptive FIR filter 206 utilizes a least mean squares (LMS) fit, and completes the equalization of the input data samples.

In a specific application, four separate sets of coefficients are available for use by the IIR filter 202, effectively transforming the IIR filter 202 into any one of four different IIR filters without requiring a physical hardware change. The four sets of coefficients are established to represent the IIR filters 202 that best fit to the overall conditions of a wide set of cable types and/or lengths.

The filter selector 204 tests each of the possible IIR filters, and selects at that time the particular IIR filter which yields the least error in the filter selector 204. The output of the selected IIR filter 202 is passed to the adaptive FIR filter 206, which improves the total equalization of the received data signal.

Figure 3:
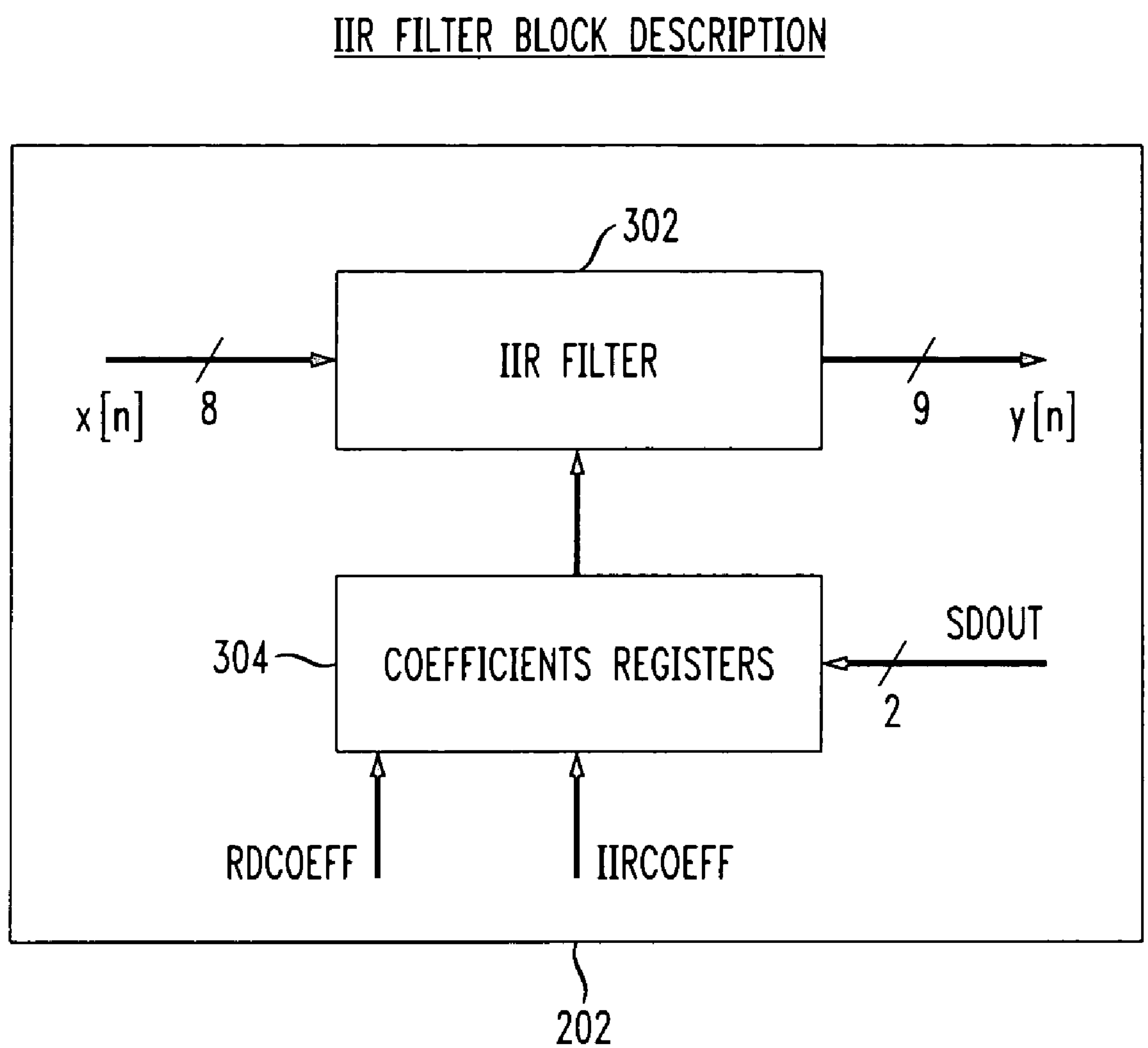
FIG. 3 is a detailed block diagram of the IIR filter shown in FIG. 2.

FIG. 3 is a detailed block diagram of the IIR filter 202 shown in FIG. 2.

In particular, in FIG. 3, the IIR filter 202 comprises an IIR filter core 302, and a coefficient register area 304 storing the various sets (e.g., 4 sets) of coefficients for the IIR filter core 302. The coefficient registers 304 are selected by the filter selector 204, and the selected coefficient set is loaded into the IIR core 302. In the disclosed embodiment, only one set of coefficients are loaded into the IIR filter core 302 at any one time, as selected by the 2 bit wide selector bus SDOUT from the filter selector 204.

Preferably, the available sets of coefficients for the IIR filter 202 are loaded into the coefficients register area 304 prior to startup of the equalization process.

In the disclosed embodiment, the IIR filter 202 implements the following equations:

$$y[n]=a_1x[n]+a_2x[n-1]+\ldots+a_8x[n-7]-b_2y[n-1]-\ldots-b_7y[n-7]$$

$$H(z)=\frac{a_1+a_2z^{-1}+a_3z^{-2}+a_4z^{-3}+a_5z^{-4}+a_6z^{-5}+a_7z^{-6}+a_8z^{-7}}{1+b_2z^{-1}+b_3z^{-2}+b_4z^{-3}+b_5z^{-4}+b_6z^{-5}+b_7z^{-6}+b_8z^{-7}}$$

Figure 4:
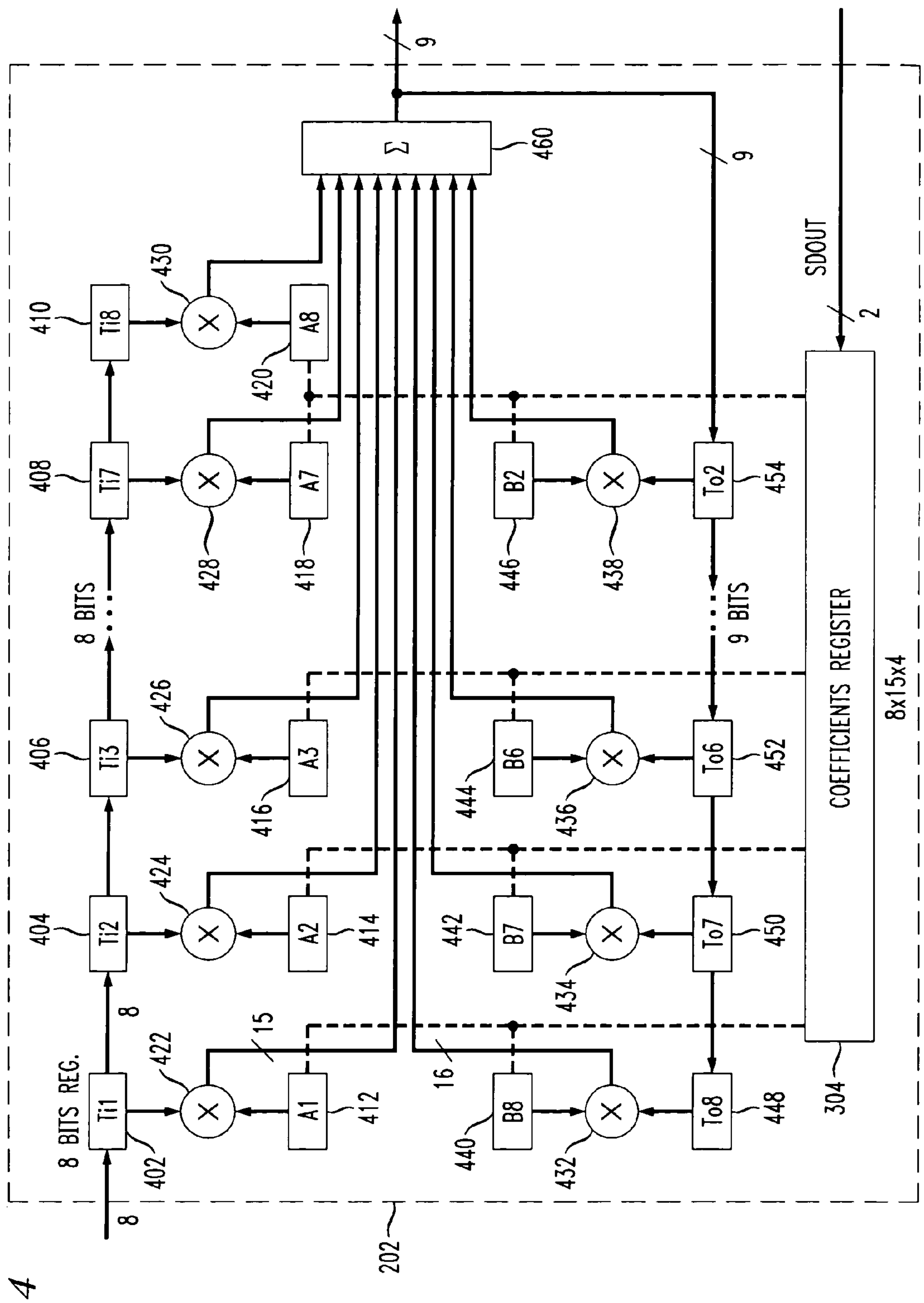
FIG. 4 shows a schematic of a particular implementation of the IIR filter shown in FIGS. 2 and 3.

FIG. 4 shows a schematic of a particular implementation of the IIR filter 202 shown in FIGS. 2 and 3.

In particular, in FIG. 4, the IIR filter 202 includes a plurality of 8-bit coefficients 412–420, 440–446 which are loaded with a selected set of coefficients from the coefficients register 304, based on an IIR filter selection from the filter selector 204 over the SDOUT bus.

Input samples are loaded into 8-bit registers 402–410 constituting an input delay line. The input samples are shifted through the 8-bit registers 402–410 every ¼ T.

Output samples are loaded into output 9-bit registers 448–454 constituting an output feedback delay line.

Multiplication operations are performed in the various multipliers 422–438, and the results are appropriately summed in summer 460, to ultimately arrive at the desired equations for the IIR filter 202.

Figure 5:
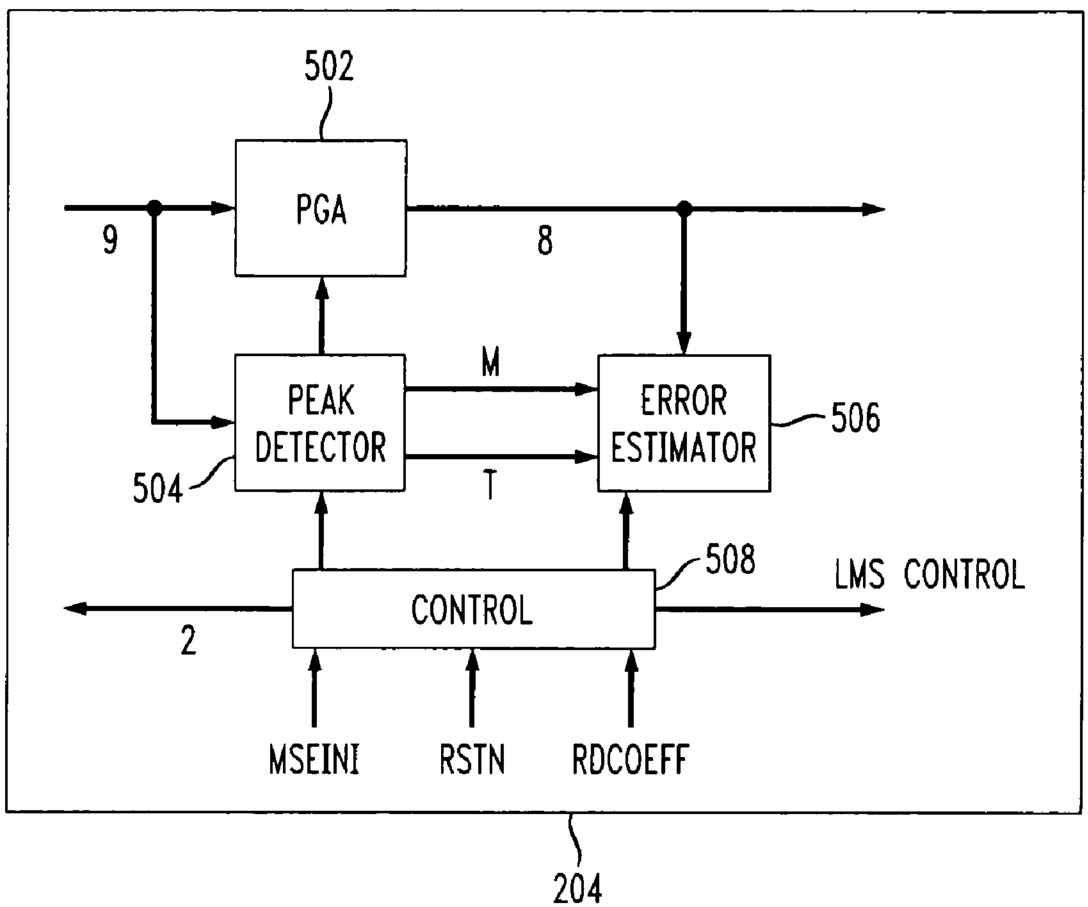
FIG. 5 is a detailed block diagram of the filter selector shown in FIG. 2.

FIG. 5 is a detailed block diagram of the filter selector 204 shown in FIG. 2.

In particular, as shown in FIG. 5, the filter selector comprises a programmable gain amplifier 502, an error estimator 506, a peak detector 504, and a state machine and control block 508.

The PGA 502 converts the 9-bit input signal from the IIR filter 202 into an 8-bit output signal, the error estimator 506 calculates the total absolute error of the current IIR filter, and the peak detector 504 detects the maximum value of the input IIR filtered data signal.

Figure 6:
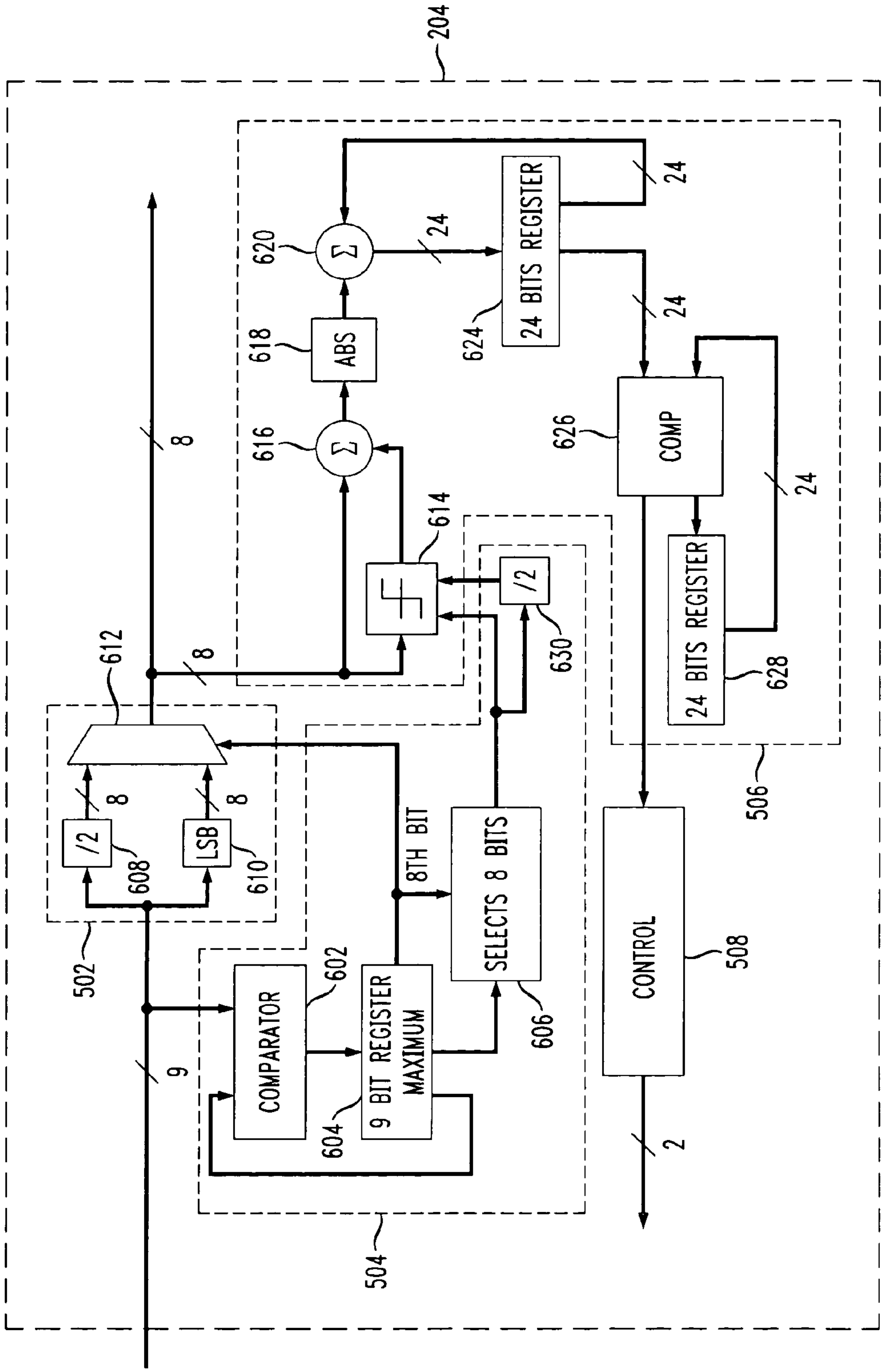
FIG. 6 is a more detailed block diagram of the filter selector shown in FIGS. 2 and 5.

FIG. 6 is a more detailed block diagram of the filter selector 204 shown in FIGS. 2 and 5.

In particular, the PGA 502 includes a multiplexer 612 which selects eight bits from the 9-bit input IIR filtered data samples, depending upon on the value of the maximum data sample detected by the peak detector 504. The PGA 502 includes a divide by 2 block 608, and a least significant bit block, each fed into and selected by the multiplexer 612.

The peak detector 504 stores the value of the maximum data sample detected in the 9-bit register 604. The peak detector 504 includes a comparator 602 to compare an input 9-bit data sample to a currently established maximum data value maintained in a 9-bit register 604. The most significant 8 bits of the maximum value are selected in block 606, which is divided by 2 in divider 630.

The error estimator 506 includes a slicer 614, a summer 616, an absolute value determiner 618, another summer 620, a 24-bit register 624, a comparator 626, and another 24-bit register 628.

The error estimator 506 calculates the total absolute error by comparing the input IIR filtered data sample to a sliced version of the same signal as follows.

$$TAE=\sum_{1}^{16384}|x[n]-a[n]|$$

where x[n] is the input signal, and a[n] is the sliced signal.

The slicer 614 in the error estimator 204 creates the sliced signal from the maximum value detected. The threshold of the slicer 614 is equal to the maximum value divided by two (i.e., T=M/2).

$$\text{if\_}x[n]>T, a[n]=M$$

$$\text{if\_}-T<x[n]<T, a[n]=0$$

$$\text{if\_}x[n]<-T, a[n]=-M$$

The error estimator 506 stores the total absolute error detected using each of the available IIR filters (e.g., each of the 4 IIR filters in the given example). After each of the available IIR filters are tested, the error estimator 506 and the control block 508 outputs the selection of the IIR filter providing the least absolute error.

In operation, the filter selector 204 waits 256 samples for the IIR filter transient to be completed. The next 16128 data samples are used by the peak detector 504 to find the maximum value of the input IIR filtered data, and the last 16384 data samples are used by the error estimator 506 to calculate the total absolute error.

Figure 7:
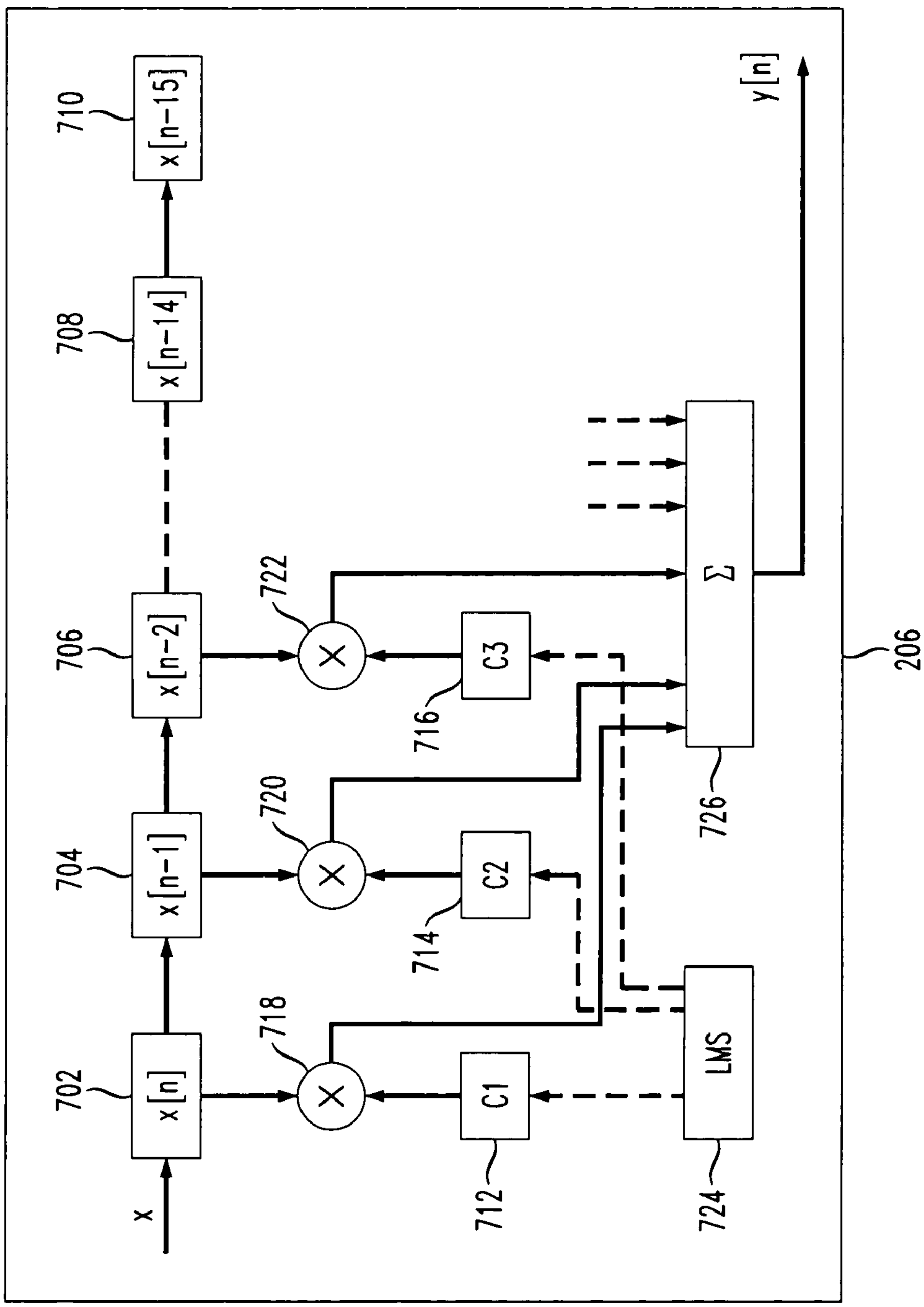
FIG. 7 shows a block diagram of the adaptive FIR filter shown in FIG. 2.
Figure 8:
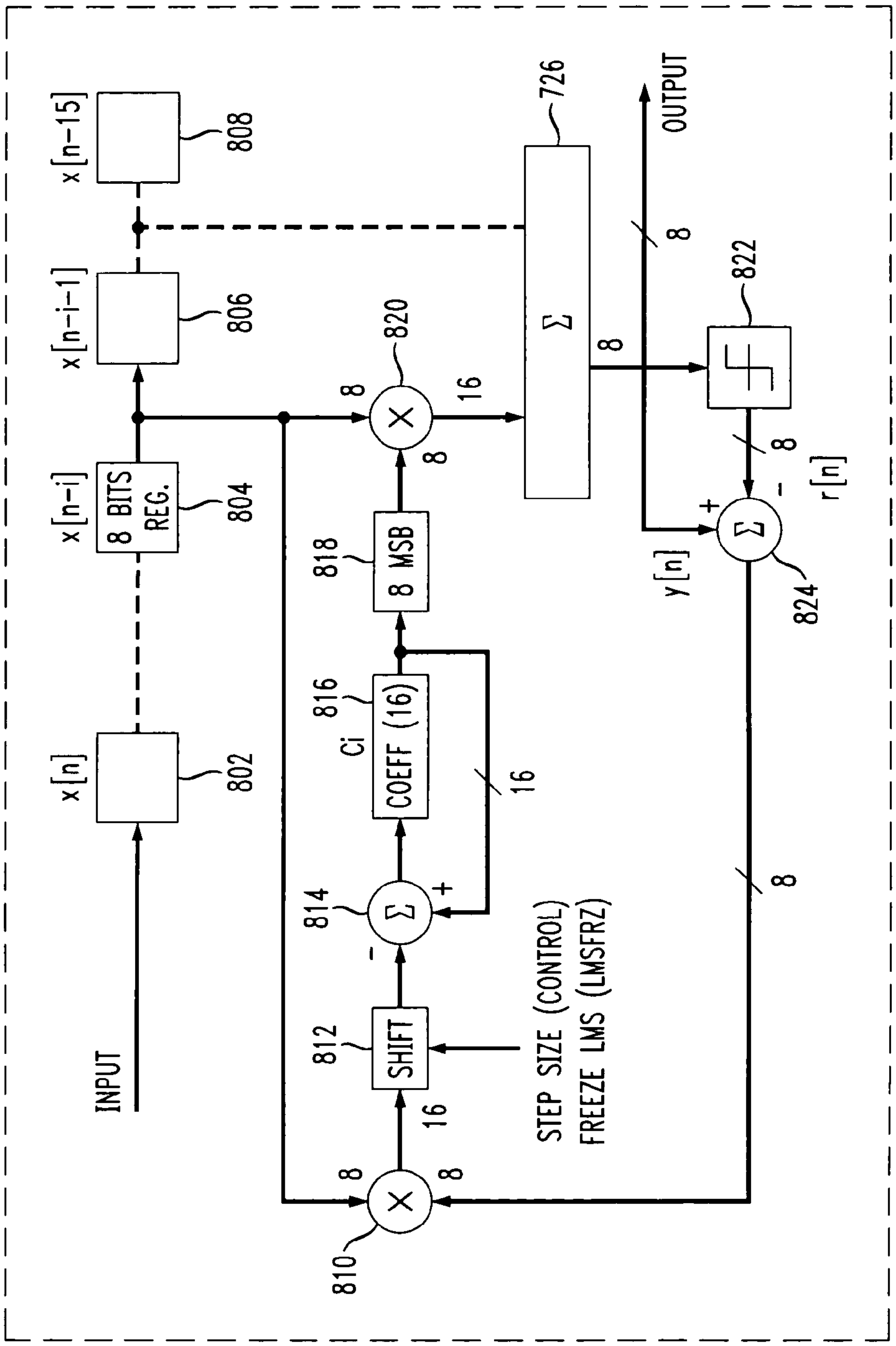
FIG. 8 shows a more detailed block diagram of an exemplary implementation of the adaptive FIR filter shown in FIGS. 2 and 7.
Figure 9:
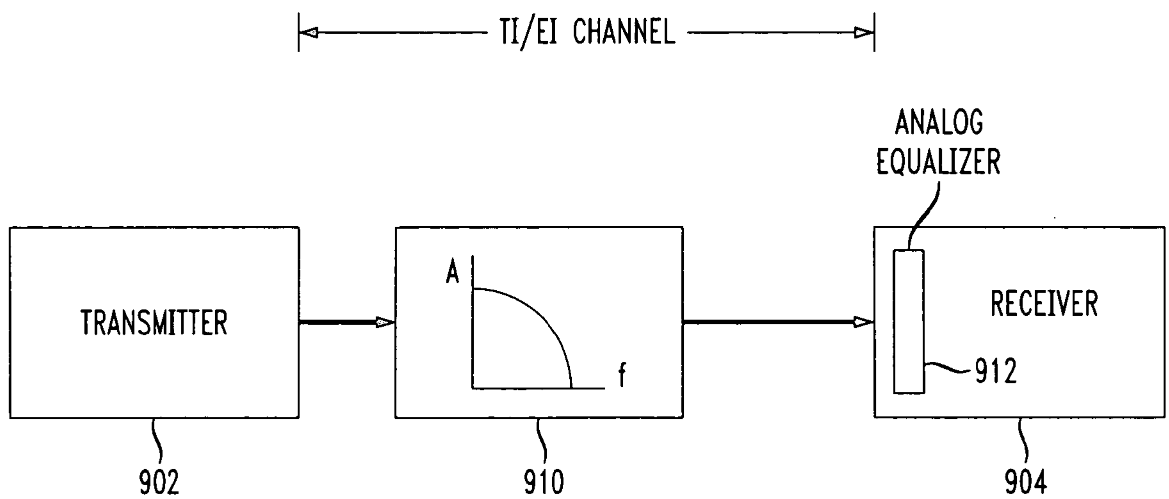
FIG. 9 depicts the affects of a transmission path between a T1/E1 transmitter and a complementary T1/E1 receiver having a conventional equalizer.

FIG. 7 shows a block diagram of the adaptive FIR filter 206 shown in FIG. 2, and FIG. 8 shows a more detailed block diagram of an exemplary implementation of the adaptive FIR filter 206 shown in FIGS. 2 and 7.

In particular, as shown in FIGS. 7 and 8, the adaptive FIR filter 206 is implemented with 16 taps. As shown in FIG. 7, the input samples are stored in a delay chain of 8-bit registers 702–710 (802–808 in FIG. 8), and shifted every ¼ T. Coefficients for the FIR filter 206 are stored in 16-bit registers 712–716 (816 in FIG. 8).

In the implementation of FIGS. 7 and 8, only the eight most significant bits out of the 16 bits of the filter coefficients are used to evaluate the output. The remaining eight bits are used to store the small corrections to the coefficients 712–716, and thus adaptively adjusts the FIR filter 206.

The FIR filter 206 preferably includes an adaptive algorithm, e.g., a least mean squares algorithm. A least mean squares algorithm was chosen in the given example because of the properties of a T1/E1 signal, e.g., correlated source, periodic patterns, etc. The FIR filter 206 outputs 8-bit samples, and implements the following equations.

FIR equation:

$$y[n]=c_1x[n]+c_2x[n-1]+\ldots+c_{15}x[n-14]+c_{16}x[n-15]$$

Coefficients correction (LMS algorithm):

$$C_i(\text{new})=C_i(\text{old})-k\cdot x[n-i]\cdot(y[n]-r[n])$$

where r[n] is the reference signal used to measure the error of the output signal, and k is the step size.

The signal output from the adaptive FIR filter 206 is sliced using a slicer 822 as shown in FIG. 8 to generate the reference signal r[n]. In particular, the slicer 822 implements the following equations:

$$\text{if\_}y[n]>0.5, r[n]=1$$

$$\text{if\_}y[n]<-0.5, r[n]=-1$$

otherwise, r[n]=0

The coefficients (712–716 in FIG. 7, 816 in FIG. 8) are updated every sample.

The step size in the adaptive FIR filter 206 is a number always lower than one, e.g., ½, ¼, 1/16, etc. The step size is reduced as the algorithm converges, and can be set equal to zero (i.e., no coefficients correction).

In order to accomplish fast convergence of the least mean square algorithm, the initial value of the coefficients is set to the autocorrelation function of an AMI-RZ (amplitude mark inversion, return to zero) signal, characteristic in the transmission of a T1/E1 signal. It is common to transmit periodic signals in a T1/E1 transmission. Some alarms to be transmitted have this characteristic. A periodic pattern causes a major problem to equalization algorithms.

This issue is solved, e.g., by using a periodic pattern detector 113 as shown in FIG. 1. When a periodic pattern is detected by the periodic pattern detector 113, the adaptive equalization is frozen and the output samples come directly from the periodic pattern detector 113.

A digital, adaptive equalizer in accordance with the principles of the present invention provides adaptation to a much larger range of cable types and/or lengths, particularly with automatic reprogramming of coefficients for the IIR filter.

While the invention has been described with reference to the exemplary embodiments thereof, those skilled in the art will be able to make various modifications to the described embodiments of the invention without departing from the true spirit and scope of the invention.

What is claimed is:

1. A digital adaptive equalizer for a data communication path, comprising:
- a programmable infinite impulse response filter to implement any of a plurality of infinite impulse response filter transfer functions;
- a filter selector to select any one of said plurality of infinite impulse response filter transfer functions for said programmable infinite impulse response filter; and
- a finite impulse response digital filter to receive an output from said programmable infinite impulse response filter;
- wherein said digital adaptive equalizer at least one of corrects for and equalizes impairments caused in a high speed transmission signal.

2. The digital adaptive equalizer for a data communication path according to claim 1, wherein:
- said finite impulse response digital filter adapts a transfer function to best fit an input data signal.

3. The digital adaptive equalizer for a data communication path according to claim 2, wherein:
- said transfer function is adapted based on a least mean square algorithm.

4. The digital adaptive equalizer for a data communication path according to claim 1, wherein said data communication path comprises one of:
- a T1 communication path; and
- an E1 communication path.

5. The digital adaptive equalizer for a data communication path according to claim 4, wherein:
- said data communication path is formed by a twisted pair.

6. The digital adaptive equalizer for a data communication path according to claim 4, wherein:
- said data communication path is formed by a coaxial cable.

7. The digital adaptive equalizer for a data communication path according to claim 4, wherein:
- said data communication path is formed by a wireless RF medium.

8. The digital adaptive equalizer for a data communication path according to claim 1, further comprising:
- an analog-to-digital converter to digitize a received substantially raw T1/E1 signal for input to said digital adaptive equalizer.

9. The digital adaptive equalizer for a data communication path according to claim 1, wherein:
- said plurality of transfer functions in said infinite impulse response filter are formed by a selection of any of at least four sets of coefficients available to said infinite impulse response filter.

10. The digital adaptive equalizer for a data communication path according to claim 9, wherein:
- one of said at least four sets of coefficients is selected based on a determination of a least amount of error in a received data signal.

11. The digital adaptive equalizer for a data communication path according to claim 9, wherein:
- an initial value of said at least four sets of coefficients is set to an autocorrelation function of an amplitude mark inversion, return to zero signal.

12. A method of digitally equalizing a received T1/E1 data signal, comprising:
- firstly filtering said received T1/E1 data signal using a infinite impulse response digital filter; and
- adaptively adjusting an output of said infinite impulse response digital filter to accurately match an inverse response of a transmission channel used to transmit said received T1/E1 data signal;
- wherein said method of digitally equalizing a received T1/E1 data signal at least one of corrects for and equalizes impairments caused in said received T1/E1 data signal.

13. The method of digitally equalizing a received T1/E1 data signal according to claim 12, further comprising:
- detecting a periodic pattern in said received T1/E1 data signal.

14. The method of digitally equalizing a received T1/E1 data signal according to claim 13, further comprising:
- freezing said adaptive adjustment when a periodic pattern is detected.

15. The method of digitally equalizing a received T1/E1 data signal according to claim 12, wherein:
- said adaptively adjusting step selects and implements one of a plurality of transfer function coefficients available for said infinite impulse response digital filter.

16. The method of digitally equalizing a received T1/E1 data signal according to claim 15, wherein:
- an initial value of said plurality of transfer function coefficients is set to an autocorrelation function of an amplitude mark inversion, return to zero signal.

17. The method of digitally equalizing a received T1/E1 data signal according to claim 12, further comprising:
- secondly filtering said firstly filtered received T1/E1 data signal.

18. The method of digitally equalizing a received T1/E1 data signal according to claim 17, wherein:
- said secondly filtering performs a finite impulse response transfer function on said firstly filtered received T1/E1 data signal.

19. The method of digitally equalizing a received T1/E1 data signal according to claim 17, further comprising:
- adaptively adjusting coefficients for said finite impulse response transfer function on a basis of a best fit algorithm.

20. The method of digitally equalizing a received T1/E1 data signal according to claim 19, wherein:
- said best fit algorithm is a least mean square algorithm.

21. Apparatus for digitally equalizing a received T1/E1 data signal, comprising:
- means for firstly filtering said received T1/E1 data signal using an infinite impulse response digital filter; and means for adaptively adjusting an output of said infinite impulse response digital filter to accurately match an inverse response of a transmission channel used to transmit said received T1/E1 data signal;

wherein said apparatus at least one of corrects for and equalizes impairments caused in said received T1/E1 data signal.

22. The apparatus for digitally equalizing a received T1/E1 data signal according to claim 21, wherein:

said means for adaptively adjusting selects and implements one of a plurality of transfer function coefficients available for said infinite impulse response digital filter.

23. The apparatus for digitally equalizing a received T1/E1 data signal according to claim 21, further comprising:

means for secondly filtering said firstly filtered received T1/E1 data signal.

24. The apparatus for digitally equalizing a received T1/E1 data signal according to claim 23, wherein said means for secondly filtering comprises:

a finite impulse response transfer function on said firstly filtered received T1/E1 data signal.

25. The apparatus for digitally equalizing a received T1/E1 data signal according to claim 24, further comprising:

means for adaptively adjusting coefficients for said finite impulse response transfer function on a basis of a best fit algorithm.

26. The apparatus for digitally equalizing a received T1/E1 data signal according to claim 25, wherein:

said best fit algorithm is a least mean square algorithm.

* * * * *